United States Patent
Ichikizaki et al.

(10) Patent No.: US 10,149,397 B2
(45) Date of Patent: Dec. 4, 2018

(54) PROTECTING COVER AND ELECTRONIC DEVICE ASSEMBLY

(71) Applicant: HONDA MOTOR CO., LTD., Tokyo (JP)

(72) Inventors: Yasunori Ichikizaki, Wako (JP); Masato Hirakawa, Wako (JP); Takashi Yamashita, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/623,383

(22) Filed: Jun. 15, 2017

(65) Prior Publication Data

US 2018/0020561 A1 Jan. 18, 2018

(30) Foreign Application Priority Data

Jul. 15, 2016 (JP) .................................. 2016-140073

(51) Int. Cl.
*H05K 7/20* (2006.01)
*H05K 5/03* (2006.01)
*H05K 5/00* (2006.01)

(52) U.S. Cl.
CPC ............. *H05K 5/03* (2013.01); *H05K 5/0004* (2013.01); *H05K 7/20127* (2013.01); *H05K 7/20409* (2013.01)

(58) Field of Classification Search
CPC ............... H05K 7/20127; H05K 7/202; H05K 7/20409; H05K 7/206–7/20609; G02B 6/4269

See application file for complete search history.

(56) References Cited

U.S. PATENT DOCUMENTS

| | | | | |
|---|---|---|---|---|
| 5,329,426 A | * | 7/1994 | Villani | ............... H01L 23/4093 24/625 |
| 5,842,514 A | * | 12/1998 | Zapach | ................. H01L 23/427 165/104.33 |
| 6,292,363 B1 | * | 9/2001 | Shinohara | ............ H02M 7/003 165/104.33 |
| 6,614,389 B2 | * | 9/2003 | Suzuki | ................... G01S 7/023 180/167 |

(Continued)

FOREIGN PATENT DOCUMENTS

JP 02-84392 U 6/1990
JP 05-259325 10/1993

(Continued)

OTHER PUBLICATIONS

Japanese Office Action for corresponding JP Application No. 2016-140073, dated Dec. 19, 2017 (w/ English machine translation).

(Continued)

*Primary Examiner* — Robert J Hoffberg
(74) *Attorney, Agent, or Firm* — Mori & Ward, LLP

(57) ABSTRACT

A protecting cover includes a body and an opening. The body covers a case that has an outer surface and that includes components connected to each other at least one connecting portion to house a circuit board in an inner side of the case opposite to the outer surface. The body is to cover at least part of the at least one connecting portion. The opening exposes at least part of the outer surface of the case.

16 Claims, 3 Drawing Sheets

(56) References Cited

U.S. PATENT DOCUMENTS

| | | | | |
|---|---|---|---|---|
| 6,820,686 B2* | 11/2004 | Yang | ............... | H05K 7/209 165/185 |
| 7,019,685 B2* | 3/2006 | Suzuki | ............... | G01S 7/023 180/167 |
| 7,085,136 B2* | 8/2006 | Lin | ............... | G06F 1/20 165/135 |
| 7,142,151 B2* | 11/2006 | Suzuki | ............... | G01S 7/023 342/70 |
| 7,265,984 B2* | 9/2007 | Numata | ............... | H05K 7/2049 165/104.33 |
| 7,281,862 B2* | 10/2007 | Oen | ............... | G02B 6/4201 385/88 |
| 7,724,526 B2* | 5/2010 | Hinze | ............... | H01L 23/367 165/104.33 |
| 8,273,985 B2* | 9/2012 | Lin | ............... | H02G 3/088 174/50 |
| 8,809,697 B2* | 8/2014 | Nicol | ............... | H05K 7/20127 174/377 |
| 8,881,931 B2* | 11/2014 | Chiu | ............... | H05K 5/0213 215/264 |
| 9,165,854 B2* | 10/2015 | Chun | ............... | H01L 23/3672 |
| 9,730,362 B2* | 8/2017 | Chen | ............... | H05K 7/20409 |
| 9,861,015 B2* | 1/2018 | Sagneri | ............... | H05K 7/209 |
| 2006/0187643 A1* | 8/2006 | Tsurufusa | ............... | H05K 7/2049 361/704 |
| 2007/0017686 A1* | 1/2007 | Numata | ............... | H01L 23/367 174/17 VA |
| 2012/0048871 A1* | 3/2012 | Chiu | ............... | H05K 5/0213 220/745 |
| 2012/0170224 A1* | 7/2012 | Fowler | ............... | H05K 7/1424 361/720 |
| 2016/0169594 A1* | 6/2016 | De Bock | ............... | H05K 7/20336 165/80.3 |

FOREIGN PATENT DOCUMENTS

| | | |
|---|---|---|
| JP | 09-074641 | 3/1997 |
| JP | 2004-72907 | 3/2004 |
| JP | 2010-30385 | 2/2010 |
| JP | 2012-069647 | 4/2012 |
| JP | 2014-217255 | 11/2014 |

OTHER PUBLICATIONS

Japanese Office Action for corresponding JP Application No. 2016-140073, dated Mar. 27, 2018 (w/ English machine translation).

* cited by examiner

CROSS SECTIONAL ARROW VIEW
TAKEN ALONG THE LINE A-A

CROSS SECTIONAL ARROW VIEW
TAKEN ALONG THE LINE B-B

PROTECTING COVER AND ELECTRONIC DEVICE ASSEMBLY

CROSS-REFERENCE TO RELATED APPLICATIONS

The present application claims priority under 35 U. S. C. § 119 to Japanese Patent Application No. 2016-140073, filed Jul. 15, 2016. The contents of this application are incorporated herein by reference in their entirety.

BACKGROUND

1. Field

The present invention relates to a protecting cover and an electronic device assembly.

2. Description of the Related Art

In an electronic device housing a circuit board in an internal space of a case body, an electronic device having a vent plug for reducing the pressure difference between the pressure of the internal space and the pressure outside the case body is used such as an electronic control device for vehicle. The pressure balance of the case body between the internal pressure and the external pressure is kept by a ventilation passage communicating with the inside from the surface of the case body to which the vent plug is attached. However, the ventilation passage can be an intrusion passage of foreign matters such as the water and the dust.

In case of using the electronic control device which is attached to a part of the vehicle body such as an engine room, which is apt to be infiltrated, a waterproofing measure becomes indispensable in the vicinity of the vent plug and the ventilation passage. For example, in Japanese Laid-open Patent Publication No. 2012-69647, there is a well-known waterproofing measure to build a protective wall around the vent plug and the ventilation passage for preventing the water from entering. However, it is not fully sufficient to prevent the water entering to the inside of the case body depending on the degree of infiltrating. Moreover, for example, it is possible to reduce the degree of infiltrating to the vent plug and the ventilation passage by covering the approximately whole surface of the case body, including the vent plug and the ventilation passage, with a plate-like cover. However, since the cover prevents the heat radiation from the case body, the radiation performance of the electronic control device is degraded.

SUMMARY

According to one aspect of the present invention, a protecting cover is characterized in that the protecting cover is attached to an electronic device with a case body configured such that a plurality of components is connected. The protecting cover at least partly covers connecting portion which connects the plurality of components of the case body, and simultaneously has an opening portion which at least partly exposes the surface of the case.

According to another aspect of the present invention, a protecting cover includes a body and an opening. The body covers a case that has an outer surface and that includes components connected to each other at least one connecting portion to house a circuit board in an inner side of the case opposite to the outer surface. The body is to cover at least part of the at least one connecting portion. The opening exposes at least part of the outer surface of the case.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
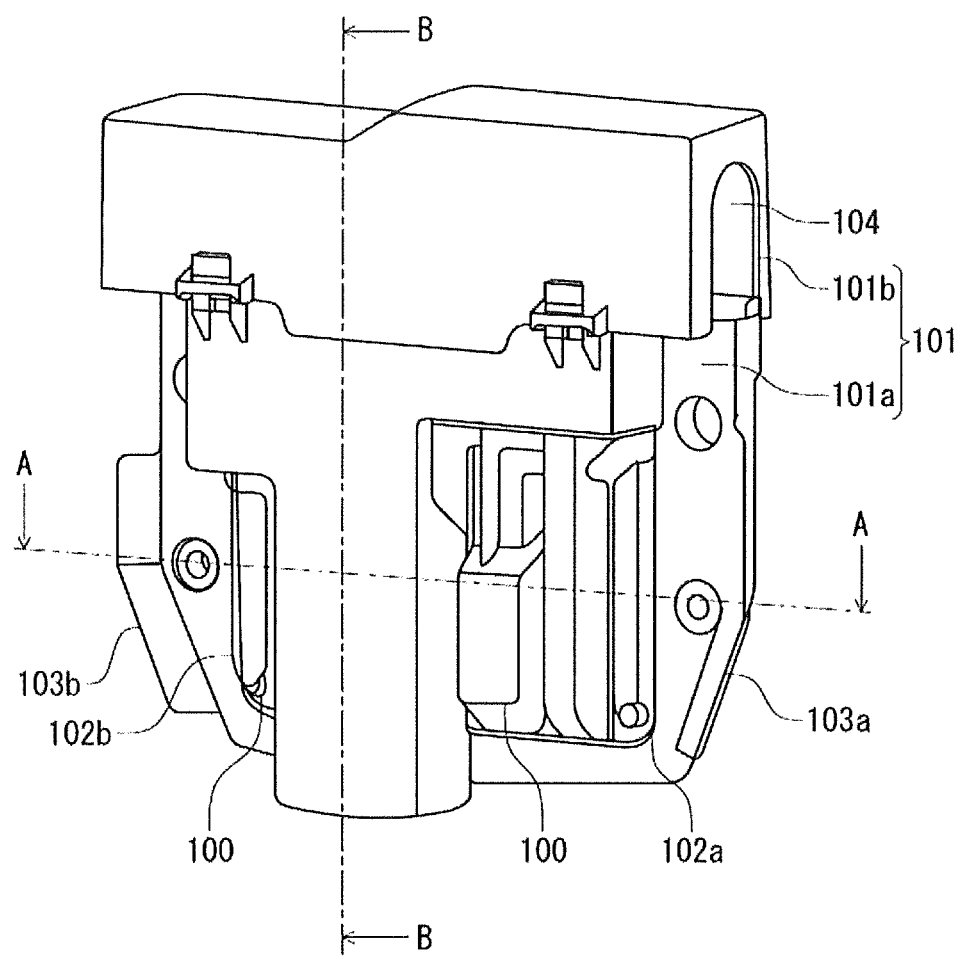
FIG. 1 is a front perspective view of the electronic device with a protecting cover according to the one embodiment of the present invention.

The embodiments will now be described with reference to the accompanying drawings, wherein like reference numerals designate corresponding or identical elements throughout the various drawings.

Hereinafter, the embodiments of the present invention will be explained with reference to the drawings. FIG. 1 is the front perspective view of the electronic device assembly configured with a protecting cover 101 and an electronic device 100, according to the present embodiment. The electronic device 100 is an Electrical Control Unit: ECU, for example which is mounted on the vehicle. The configuration of the electronic device of the present invention is not limited to this, and can be widely applied to ordinal electronic devices.

For example, the protecting cover 101 is configured with a box-shaped case portion 101a and a cap portion 101b which is attached to the illustrated upper portion of the case portion 101a and can be used as a lid. Especially, according to the present embodiment, the protecting cover 101 covers and protects most of the electronic device 100 from foreign substances from the outside environment such as the water and the dust, for example. Opening portions 102a, 102b which are the inner area surrounded by the illustrated dotted line, are respectively provided at the two positions corresponding to heat radiating portions 213a, 213b which are mentioned below, and on which a radiation fin of the electronic device 100 is formed. Accordingly, the heat radiating portions 213a, 213b of the electronic device 100 are exposed to the outside environment without being covered by the protecting cover 101 and can be cooled effectively by the outside air.

Moreover, the protecting cover 101 according to the present embodiment has air guiding plates 103a, 103b which extend to the front direction of the front surface in the vicinity of the end portion of the front surface of the case portion 101a, which is the exposed surface of the heat radiating portion of the electronic device 100 in FIG. 1. Air guiding plates 103a, 103b have a function to catch the wind to the front surface of the case portion 101a and guide the wind to the opening portions 102a, 102b. Accordingly, it is possible to enhance the cooling efficiency of the heat radiating portions 213a, 213b of the electronic device 100 which are exposed from the opening portions 102a, 102b.

The cap portion 101b is attached to the illustrated upper portion of the case portion 101a. For example, the cap portion 101b is installed so as to cover a below-mentioned connecting portion 212 electrically connecting an unillustrated circuit board of the electronic device 100 with external devices such as an external power supply device, and to cover a connecting portion connected to an unillustrated wire harness which is connected to the connecting portion 212.

Moreover, for example, the above mentioned and unillustrated wire harness which is connected to a connector portion 212 is taken out from a harness-takeout window 104 and connected to the external device such as the external power supply device. Then, for example, if the inner diameter of the opening and the outer diameter of the wire harness are set so as not to generate a clearance between the inner periphery of the opening of the harness-takeout window 104 and the wire harness, the above mentioned cap portion 101b covers and can protect the connector portion 212 and the like from foreign substances from the outside environment, for example, such as the water and the dust. Accordingly, the protective effect of the electronic device 100 is further enhanced.

Moreover, the above mentioned cap portion 101b is not necessarily required. For example, even if the single case portion 101a can protect the electronic device 100 in the case that the electronic device 100 is installed in the environment where the amount of the water drop, the dirt, the dust, and the like which come from the illustrated upper portion seems sufficiently little, it is possible to gain the waterproof effect and the dust-proofing effect at a certain level. Moreover, the protecting cover 101 according to the present embodiment has a box-shaped body so as to house the electronic device 100 inside thereof. However, the protecting cover is not necessarily required to have a box-shaped body. For example, when the amount of the water drop, the dirt, the dust, and the like which mainly come from the front direction, and the amount of the water drop, the dirt, the dust, and the like which come from the other directions is so small to be ignored, the protecting cover 101 shown in FIG. 1 may be configured so as to have a tabular body with only the front surface part thereof for only covering the front surface of the electronic device 100.

Figure 2:
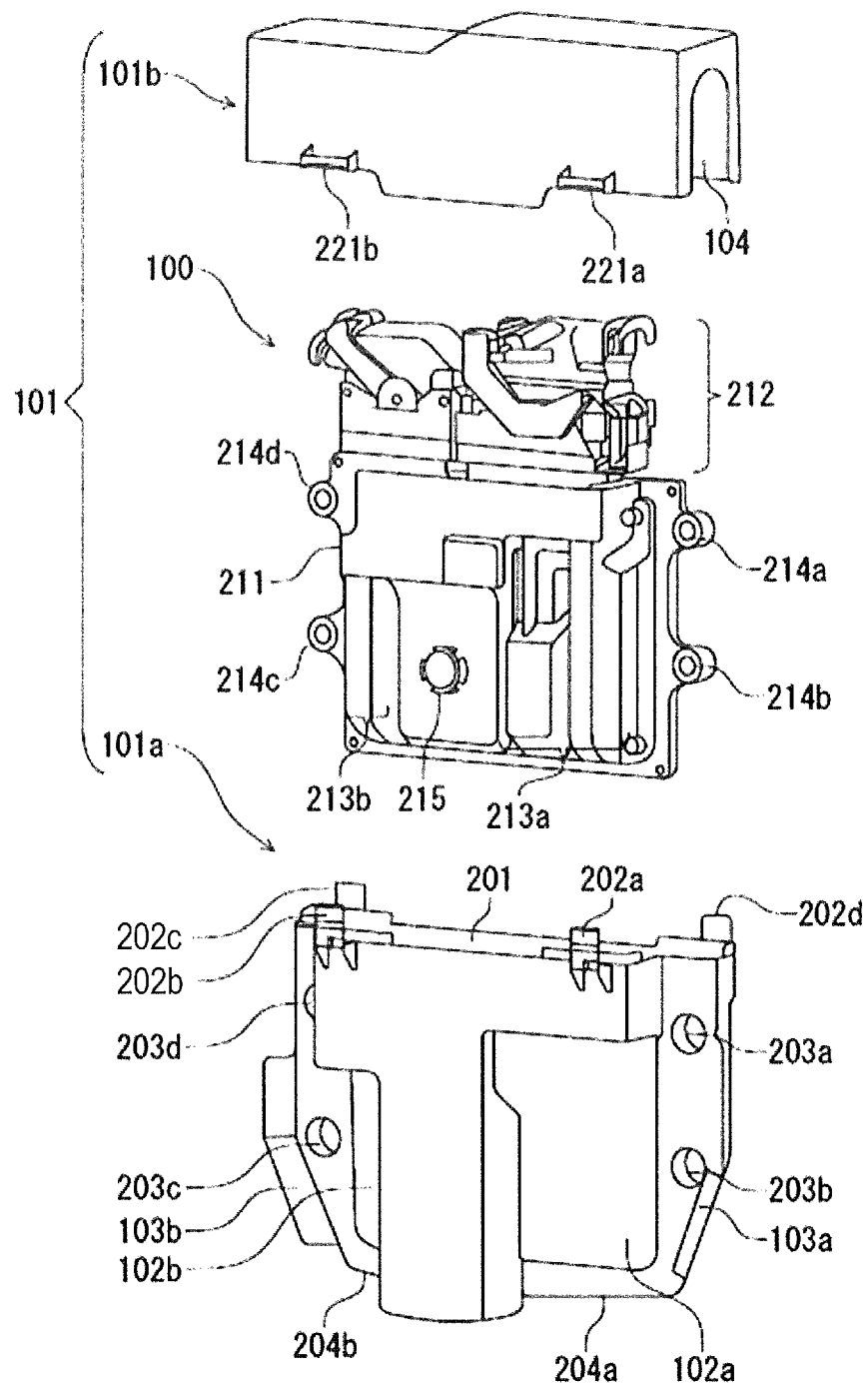
FIG. 2 is a drawing of the electronic device with the protecting cover shown in FIG. 1 in a state that a case portion and a cap portion of the protecting cover, and the electronic device are separated.

Next, with reference to FIG. 2, the configuration of the case portion 101a and the cap portion 101b of the protecting cover 101 according to the present embodiment will be explained. The configuration of the electronic device 100 which is protected by the protecting cover 101 will be also explained. FIG. 2 is a drawing of the electronic device 100 with the protecting cover 101 shown in FIG. 1, in the state that the case portion 101a, the cap portion 101b, and the electronic device 100 are separated.

The case portion 101a of the protecting cover 101 has an insertion opening 201 on the illustrated upper portion. The electronic device 100 is inserted from the insertion opening 201 and housed in the case portion 101a which has a box-shaped body. Moreover, the cap portion 101b of the protecting cover 101 is attached so as to cover the insertion opening 201 of the case portion 101a which houses the electronic device 100.

Engaging portions 221a, 221b, 221c (not shown), and 221d (not shown) are provided on the cap portion 101b at the positions corresponding to hook portions 202a, 202b, 202c, and 202d which are provided on the case portion 101a. The cap portion 101b is fixed on the case portion 101a by engaging the hook portions 202a, 202b, 202c, and 202d, with the engaging portions 221a, 221b, 221c, and 221d, respectively.

Moreover, the case portion 101a and the cap portion 101b can be fixed by optional fixing methods in addition to the method which uses the above-mentioned hook portions and engaging portions. For example, the optional methods include the way in which the cap portion 101b is directly engaged with the insertion opening 201 of the case portion 101a.

The electronic device 100 has a case body 211 and the connector portion 212. Moreover, the case body 211 has an unillustrated internal space inside thereof. For example, an unillustrated circuit board on which an electric circuit which transmits control signals to a control device and the like are housed in the internal space. Moreover, a connecter for electrically connecting an external device such as an external power supply device and the like. The connector is mounted on the circuit board. The connector projects from the case body 211 to the direction of the illustrated upper portion and forms a part of the connector portion 212.

Moreover, for example, heat radiating portions 213a, 213b configured with a plurality of radiation fins for radiating outwardly and cooling the heat generated by the electric components such as semiconductor elements or resistors and the like which are mounted on the circuit board on the surface of the above-mentioned case body 211.

Then, as mentioned above, the opening portions 102a, 102b are provided on the case portion 101a at the positions corresponding to the heat radiating portions 213a, 213b of the electronic device 100. Accordingly, the heat radiating portions 213a, 213b of the electronic device 100 which are housed in the case portion 101a are exposed from the opening portions 102a, 102b to the outside environment of the case portion 101a, and are constantly cooled by the outside air, which enhances the cooling efficiency of the electronic device 100.

Moreover, a vent plug 215 is provided on the front surface of the case body 211 of the electronic device 100, which is the surface on which the heat radiating portions 213a, 213b are formed in FIG. 2. For example, the vent plug 215 is configured with a breathing filter with the waterproof, property and the permeability for blocking a ventilation passage which is a penetrating hole connecting the internal space of the case body 211 to the outside. Moreover, the vent plug 215 has a function for reducing the environmental differences such as the pressure difference, the temperature difference, and the humidity difference between the internal space and the external space of the case body 211 of the electronic device 100, through the ventilation passage.

Moreover, fastening portions 214a, 214b, 214c, and 214d are provided on the case body 211 of the electronic device 100 so as to have penetrating holes for fixing the electronic device 100 at a desired place such as an engine room with screws and the like, for example. Moreover, penetrating holes 203a, 203b, 203c, and 203d are provided on the case portion 101a at the corresponding positions to the above mentioned fastening portions 214a, 214b, 214c, and 214d of the electronic device 100. Accordingly, the electronic device 100 is housed in the case portion 101a, and is fastened by inserting the fastening members such as screws to the above mentioned fastening portions 214a, 214b, 214c, 214d which are exposed from the penetrating holes 203a, 203b, 203c, and 203d of the case portion 101a, respectively. Accordingly, both of the electronic device 100 and the protecting cover 101 are fixed at the predetermined position including the engine room and the like.

For example, the air guiding plates 103a, 103b are provided so as to have the inclined planes which are extending from the end portion of the illustrated right side and the end portion of the illustrated left side of the case portion 101a to the right outside and the left outside, respectively, heading for the front direction of the front surface of the case portion 101a, which is the surface on which the opening portions 102a, 102b are formed in FIG. 2. Accordingly, it is possible to guide the wind heading for the front surface of the case portion 101a much more to the above mentioned opening portions 102a, 102b of the case portion 101a than the case portion without the air guiding plates 103a, 103b. As a result, for example, in the electronic device 100 which mounts the protecting cover 101 according to the present embodiment, when the electronic device 100 is attached to the engine room of the vehicle, the above mentioned air guiding plates 103a, 103b can efficiently take the traveling wind generated by the movement of the vehicle into the opening portions 102a, 102b. Then, heat radiating portions 213a, 213b of the electronic device 100, which are exposed from the opening portions 102a, 102b, can be cooled efficiently.

Moreover, the air guiding plates 103a, 103b may have at least the air guiding effect. It is not necessarily required that the inclined planes are formed as mentioned above. For example, the inclined planes may be formed so as to be approximately perpendicular to the front surface of the case portion 101a, which is the surface on which the opening portions 102a, 102b are formed in FIG. 2, depending on the installation space. Moreover, the angle formed between the inclined plane of the air guiding plate 103a and the front surface of the case portion 101a may be same as, or may be different from the angle formed between the inclined plane of the air guiding plate 103b and the front surface of the case portion, respectively. Furthermore, the shape of the air guiding plate may be not only in a plate shape, but also in a curved shape.

Moreover, the air guiding plates 103a, 103b of the protecting cover 101 may be integrally formed with the case portion 101a, or may be formed separately from the protecting cover 101 and fixed on the protecting cover 101 by welding or with screws and the like. When the air guiding plates 103a, 103b and the case portion 101a are formed separately, the components can be configured with different materials indifferent shapes, respectively. For example, the air guiding plates 103a, 103b can be made of metallic material, and the case portion 101a can be made of resin material. It is convenient for designing. For example, the air guiding plates 103a, 103b can be fixed and used on the case portion 101a in an I-shape so as to be appropriately shaped depending on the wind condition at the installation position of the electronic device 100 by types of vehicles on which the electronic device 100 is mounted. Moreover, the case portion 101a and the air guiding plates 103a, 103b can select the materials depending on the necessary conditions including strength, heat conductivity, and the like.

Figure 3A:
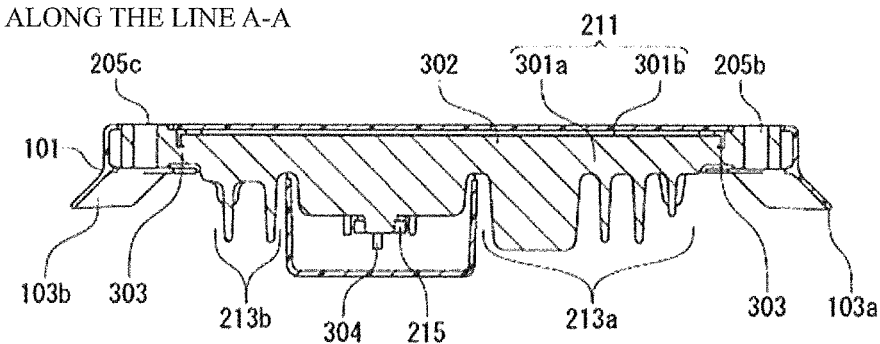
FIG. 3A and FIG. 3B are cross sectional arrow views of the electronic device with the protecting cover shown in FIG. 1, which is a cross sectional arrow view taken along the line A-A and a cross sectional arrow view taken along the line B-B.
Figure 3B:
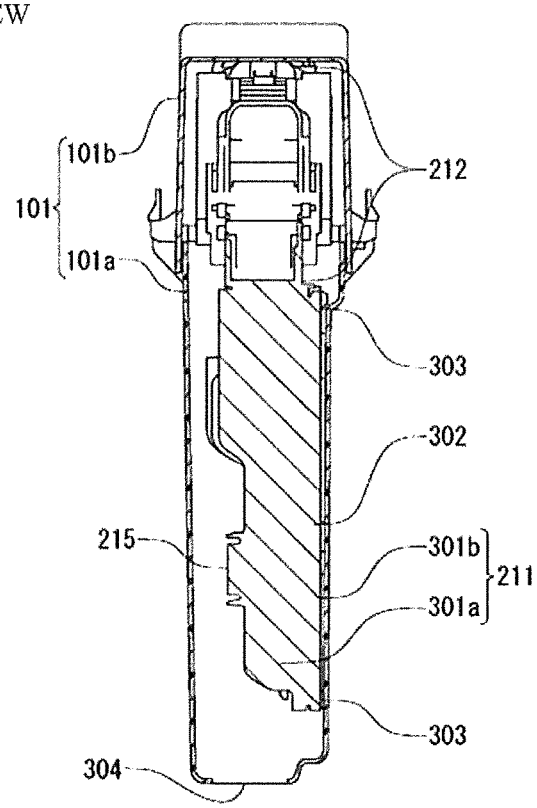

FIG. 3A and FIG. 3B are cross sectional arrow views of the electronic device 100 with the protecting cover 101 shown in FIG. 1, which is a cross sectional arrow view taken along the line A-A and a cross sectional arrow view taken along the line B-B. Moreover, there are the internal space and the circuit board housed in the internal space inside the case body 211. The drawings are simplified so as to facilitate understanding. In FIG. 3A and FIG. 3B, the cross section of the case body 211 is shown so as to be totally black-painted. The detail illustration of the inside structure of the case body 211, which includes the above mentioned circuit board and the like, is omitted.

Then, the illustrated lower surface in FIG. 3A and the illustrated left surface in FIG. 3B are corresponding to the front surface of the protecting cover 101 shown in FIGS. 1, 2, which is the surface on which the opening portions 102a, 102b are formed in FIGS. 1, 2. Moreover, hereinafter, the illustrated upper side in FIG. 3A and the illustrated right surface in FIG. 3B are called as the back surfaces.

Generally, the case body of the electronic device is often configured with two or more than two components, for example, with two bodies including a case and a cover, which are a case 301a and a cover 301b separated by a dotted line 302 shown in FIG. 3A and FIG. 3B in the present embodiment. Moreover, generally, a resin O-ring or a resin sealing agent are often applied on, for example, an annular-shaped contacting surface between the case and the cover, and often seals the contacting part from the outside air, in order to keep the airtightness inside the case body. The present embodiment uses a sealing face 303 shown in a white square in FIG. 3A and FIG. 3B as a sealing agent. Moreover, for example, the same sealing structure can be applied to the space between the vent plug 215 provided on the case body 211 and the case body 211. The sealing portion has relatively lower resistance to the foreign substances from the outside environment including the water, the dust, and the like than the other part of the case body. The development of the aged deterioration depending on the working condition of the seal portion may cause a problem that the water and the dust enter from the clearance of the sealing portion.

Meanwhile, in the electronic device assembly which is configured with the protecting cover 101 and the electronic device 100 according to the present embodiment, the protecting cover 101 constantly covers the sealing face 303 between the case 301a and the cover 301b of the case body 211, and the vent plug 215. Accordingly, the sealing face 303 and the vent plug 215 are protected from the foreign substances from the outside environment, for example, the water and the dust and the like. Then, the aged deterioration of the electronic device 100 is suppressed, which can extend the product life and the service life.

Moreover, in the electronic device assembly which is configured with the protecting cover 101 and the electronic device 100 according to the present embodiment, for example, a part of the protecting cover 101 is attached so as to abut on the case body 211. Accordingly, the clearance is hardly generated between the protecting cover 101 and the case body 211. It is suppressed that the foreign substances which include the water, the dust, and the like from the outside environment, enter to the inside of the protecting cover 101. Moreover, it is not necessarily required that the protecting cover 101 and the case body 211 are configured so as to abut. If the protecting cover 101 is arranged so as to cover the sealing face 303 and the vent plug 215 of the electronic device 100, it is possible to gain a certain protective effect despite of the slight clearance between the protecting cover and the case body.

Moreover, a drain hole 304 for discharging the water is provided on the bottom portion of the protecting cover 101 according to the present embodiment. Accordingly, if the water enters from the clearance generated between the protecting cover 101 and the case body 211, it is possible to discharge the water to the outside of the protecting cover 101 through the drain hole 304.

Moreover, for example, the bottom portion of the protecting cover 101 is formed so as to be in an inclined plane which heads for the illustrated center of the protecting cover 101, like inclined bottom portions 204a, 204b of the protecting cover 101 shown in FIG. 2. This configuration enables to collect the water entered to the inside to the drain passage which is guided by the inclined plane and discharge from the drain hole 304, which controls the water so as not to be stagnant at unspecified position inside the protecting cover 101. Moreover, if the water hardly enters into the protecting cover 101, it is not necessarily required to provide the drain hole 304. Moreover, a plurality of drain hole 304 may be provided as necessary. Moreover, it may be configured such that the water is discharged from the whole bottom portion without providing the bottom portion of the protecting cover 101.

Moreover, for example, the protecting cover according to the present embodiment is configured so as to use resin materials and the like for the components. However, there is no need to limit to this. For example, metallic material with high heat conductivity can be used for the configuration with higher heat radiation. Moreover, the case portion 101a and the cap portion 101b which form the protecting cover 101 can be configured with the different materials, respectively. For example, the case portion 101a may be made of resin, and the cap portion 101b may be made of metal.

Moreover, the opening portions 102a, 102b which are provided on the protecting cover 101 according to the present embodiment are provided at the positions corresponding to the heat radiating portions 213a, 213b of the electronic device 100. It is not necessarily required to provide so as to correspond to the heat radiating portions 213a, 213b. For example, if the electronic device 100 is formed so as to partly expose any one of the surfaces, it is possible to gain a certain cooling effect.

Moreover, the protecting cover 101 according to the present embodiment has the air guiding plates 103a, 103b. However, it is not necessarily required to provide the air guiding plates 103a, 103b. For example, if heat radiation portions 213a, 213b can constantly gain the predetermined amount of wind, the protecting cover 101 may be formed without providing the air guiding plates 103a, 103b.

As explained above, the protecting cover 101 according to the present embodiment is the protecting cover 101 attached to the electronic device 100 which has the case body 211 configured such that the plurality of components including the case 301a, the cover 301b, and the vent plug 215 are connected, and the circuit board housed in the internal space of the case body 211. The protecting cover 101 at least partly covers the sealing face 303 and the vent plug 215 which forms the connecting portions for the plurality of components, and simultaneously has the opening portions 102a, 102b which at least partly expose the surface of the case body 211. This configuration enables to protect the sealing face 303, the vent plug 215, and the like which are the part with relatively lower environment-resistance performance from the foreign substances from the outside environment including the water and the dust. Simultaneously, it is possible to radiate the heat from the opening portion which is provided on the protecting cover 101 without degrading the radiation performance. Accordingly, the product life and the service life of the electronic device 100 can be extended.

Moreover, the present invention is not limited to the above-mentioned embodiment. Various modifications can be applied within the scope of the present invention.

One embodiment of the present invention is a protecting cover attached to an electronic device with a case body which is configured such that a plurality of components is connected. The present protecting cover at least partly covers a connecting portion which connects the plurality of components of the case body, and simultaneously has an opening portion which at least partly exposes the surface of the case body.

According to the other embodiment of the present invention, the position of the opening is corresponding to the position of the heat radiating portion of the electronic device.

According to the other embodiment of the present invention, the protecting cover has an air guiding plate which guides the wind to the heat radiating portion.

According to the other embodiment of the present invention, the protecting cover includes a box-shaped body with an insertion opening into which the electronic device is inserted, and a lid covering the insertion opening.

According to the other embodiment of the present invention, the protecting cover has a tabular body.

According to the other embodiment of the present invention, the protecting cover includes the connecting portion between the vent plug and the case body.

According to the other embodiment of the present invention, an electronic device assembly is configured with the protecting cover and the electronic device.

Obviously, numerous modifications and variations of the present invention are possible in light of the above teachings. It is therefore to be understood that within the scope of the appended claims, the invention may be practiced otherwise than as specifically described herein.

What is claimed is:

1. A protecting cover for attachment to an electronic device with a case body configured such that a plurality of components of the case body are interconnected, said protecting cover being configured to at least partly cover a connecting portion which connects the plurality of components of the case body with an external device, and the protecting cover having an opening portion which at least partly exposes a surface of the case body,
wherein the protecting cover is configured to entirely cover a vent plug provided on the case body, the vent plug allows air to pass into the case body and prevents water from entering an inside of the case body.

2. The protecting cover according to claim 1, wherein a position of said opening portion is corresponding to a position of a heat radiating portion of the electronic device.

3. The protecting cover according to claim 2, wherein said protecting cover has an air guiding plate which guides wind to the heat radiating portion.

4. The protecting cover according to claim 1, wherein said protecting cover includes a box-shaped body with an insertion opening into which the electronic device is inserted, and a lid covering the insertion opening.

5. The protecting cover according to claim 1, wherein said protecting cover has a tabular body.

6. An electronic device assembly comprising the protecting cover according to claim 1 and the electronic device.

7. A protecting cover comprising:
a case portion and a cap portion that are attached together to cover a case body of an electronic device, the case body has an outer surface and includes components of the case body that are connected to each other to house a circuit board of the electronic device in an inner side of the case body opposite to the outer surface; and an opening provided in the case portion to expose at least part of the electronic device such that a heat radiating portion of the electronic device extends outward through the opening, wherein the protective cover is configured to at least partially cover a vent plug provided on the case body, the vent plug allows air to pass into the case body and prevents water from entering an inside of the case body.

8. The protecting cover according to claim 7, wherein the protecting cover has an air guiding plate which guides wind to the heat radiating portion.

9. The protecting cover according to claim 7, wherein the case portion is a box-shaped body with an insertion opening into which the electronic device is inserted, and the cap portion is a lid covering the insertion opening.

10. The protecting cover according to claim 7, wherein the protecting cover has a tabular body.

11. An electronic device assembly comprising the protecting cover according to claim 7 and the electronic device.

12. A protecting cover comprising:

a case portion and a cap portion that are attached together to cover a case body of an electronic device, the case body has an outer surface and includes components of the case body that are connected to each other to house a circuit board of the electronic device in an inner side of the case body opposite to the outer surface; and an opening provided in the case portion to expose at least part of the electronic device such that a heat radiating portion of the electronic device extends outward through the opening, wherein the protective cover is configured to entirely cover a vent plug provided on the case body, the vent plug allows air to pass into the case body and prevents water from entering an inside of the case body.

13. The protecting cover according to claim 12, wherein the protecting cover has an air guiding plate which guides wind to the heat radiating portion.

14. The protecting cover according to claim 12, wherein the case portion is a box-shaped body with an insertion opening into which the electronic device is inserted, and the cap portion is a lid covering the insertion opening.

15. The protecting cover according to claim 12, wherein the protecting cover has a tabular body.

16. An electronic device assembly configured with comprising the protecting cover according to claim 12 and the electronic device.

* * * * *